United States Patent
Danovitch et al.

(10) Patent No.: US 6,893,799 B2
(45) Date of Patent: May 17, 2005

(54) DUAL-SOLDER FLIP-CHIP SOLDER BUMP

(75) Inventors: David Danovitch, Quebec (CA); Stephen Kilpatrick, Lagrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 42 days.

(21) Appl. No.: 10/248,976

(22) Filed: Mar. 6, 2003

(65) Prior Publication Data

US 2004/0175657 A1 Sep. 9, 2004

(51) Int. Cl.⁷ .............................................. H01L 23/488
(52) U.S. Cl. ...................... 430/311; 430/313; 430/330; 438/108; 257/737; 257/738
(58) Field of Search ................................ 430/311, 313, 430/330; 438/108; 257/737, 738

(56) References Cited

U.S. PATENT DOCUMENTS

| | | | |
|---|---|---|---|
| 5,024,372 A | 6/1991 | Altman et al. ......... | 228/180.22 |
| 5,244,143 A | 9/1993 | Ference et al. ........ | 228/180.21 |
| 5,775,569 A | 7/1998 | Berger et al. ............... | 228/254 |
| 5,880,017 A | 3/1999 | Schwiebert et al. ........ | 438/613 |
| 5,937,320 A | 8/1999 | Andricacos et al. ........ | 438/614 |
| 6,165,885 A | 12/2000 | Gaynes et al. .............. | 438/612 |
| 6,281,041 B1 | 8/2001 | Ho et al. ..................... | 438/106 |
| 6,341,418 B1 | 1/2002 | Brouillette et al. ........... | 29/840 |
| 6,409,073 B1 * | 6/2002 | Kaskoun et al. ....... | 228/180.22 |
| 6,413,851 B1 | 7/2002 | Chow et al. ................. | 438/613 |
| 6,667,190 B2 * | 12/2003 | Kung et al. ................. | 438/107 |
| 2002/0023945 A1 | 2/2002 | Gruber, et al. .............. | 228/225 |
| 2002/0185733 A1 * | 12/2002 | Chow et al. ................. | 257/737 |

FOREIGN PATENT DOCUMENTS

| | | |
|---|---|---|
| EP | 0 565 908 A2 | 2/1993 |
| WO | WO 97/41594 | 11/1997 |

* cited by examiner

*Primary Examiner*—John A. McPherson
*Assistant Examiner*—Daborah Chacko-Davis
(74) *Attorney, Agent, or Firm*—James J. Cioffi

(57) ABSTRACT

A method to effectively deposit multi-component solders while remaining compatible with electroplating solder bumping process. A flip-chip solder bump is formed by using electroplated solder bump technology with the addition of wettable layer of metal or solder. The remainder of the required solder volume is deposited by Injection Molded Solder (IMS) technology. This method will accommodate certain metals, as well as trace amounts of alloying, that would be difficult or impossible to electroplate. The method also allows for electrical test between deposition of the wettable layer of solder and the bulk solder, providing the advantages of a more planar surface for probe contact, with very consistent height, less solder pick-up by the test probe and elimination of the post-probe solder reflow step.

19 Claims, 4 Drawing Sheets

DUAL-SOLDER FLIP-CHIP SOLDER BUMP

BACKGROUND OF INVENTION

The present invention generally relates to a method for fabricating solder interconnections between semiconductor chips and chip carriers and, more particularly, to a dual-solder method for fabricating a flip-chip solder structure which will enable a larger variety of solders for wafer bumping.

C4 (Controlled Collapse Chip Connection) technology is a means of connecting integrated circuit chips to substrates or chip carriers in electronic packages. It is a flip-chip technology in which the interconnections are small solder balls on the chip surface with a high density area array. The top layers of the integrated circuit chip are wiring levels, separated by insulating layers of dielectric material that provide input/output for the device.

In C4 structures, the chip wiring is terminated by a plurality of metal films that form the ball-limiting metallurgy (BLM). The BLM defines the size of the solder bump after reflow, provides a surface that is wettable by the solder and that reacts with the solder to provide good adhesion and acceptable reliability under mechanical and thermal stress, and is a barrier between the integrated circuit device and the metals in the interconnection.

Certain applications, such as lead-free flip-chip solder bumps, require multi-component solder alloys, i.e., ternary, quaternary, or greater. Such solder alloys can be very difficult to electroplate from solution. On the other hand, the electroplating solder bumping process may afford specific advantages to certain applications, with respect to bump count per unit area, low stress barrier layers, etc.

The Injection Molded Solder (IMS) process, by directly depositing molten solder from a supplied solid solder alloy, is very amenable for the deposition of multi-component solder alloys. However, the current IMS process is typically for the solder deposition only and requires that all metal layers of the BLM (adhesion, barrier, wettable) be deposited by other means.

To solve the problem of electroplating multi-component alloys, one can sequentially plate each individual component of the solder alloy. However, precise relative compositions obtained by this means may be difficult to obtain, especially if some of the components are at low or trace levels. Furthermore, sequential plating is only practical for two or three components and would be very difficult to achieve for quaternary alloys or higher. The present invention, by using melting and direct deposition in liquid form of a solid solder alloy obtained by normal manufacturing means, can accommodate solder alloys with any number of components, including low or trace quantities. The present invention can therefore also accommodate certain components that would be difficult or impossible to electroplate at all, while still maintaining the advantages of the electroplating process and any electroplating tooling and infrastructure.

In an alternative method, others are avoiding electroplating altogether by means of screening multi-component solder paste directly on a sputtered BLM (IMS alone could also be used in this manner). There are limitations in the thickness of sputtered layers that, when exceeded, may cause excessive stresses on the underlying substrate/wafer. Such thicknesses, specifically for the barrier layer, may not be sufficient for particular solder alloys. The electroplating portion of this invention permits a lower stress (per given thickness) electroplated barrier metal to be deposited. The electroplating portion of this invention, by sequentially plating the barrier layer and the wettable solder layer, also provides a very clean barrier-to-solder interface and an easy solder-to-solder reflow soldering interface, as opposed to paste screening or IMS alone, which must reflow solder directly to the sputtered BLM. There are also limitations in bump density (quantity of bumps per unit area) with some of the alternatives (e.g., paste screening). The combination of electroplating and IMS in the present invention is capable of higher bump densities than such alternatives.

Accordingly, it is a purpose of the present invention to provide a means to effectively deposit multi-component solders while remaining essentially compatible with the base electroplating solder bumping process (BLM deposition, BLM patterning, etc.) thereby encompassing the aforementioned advantages of electroplating and remaining compatible with an electroplating solder bumping infrastructure (equipment, skills, etc.) A flip-chip solder bump is formed by first using known electroplated solder bump technology, with the difference being that only a small wettable layer of metal or solder (eg. pure Sn) is deposited; subsequent to completion of this electroplating bumping process, the remainder of the required solder volume is deposited by Injection Molded Solder (IMS) technology.

It is another purpose of the present invention to accommodate trace amounts of alloying that would be difficult or impossible to electroplate.

It is another purpose of the present invention to accommodate certain metals that would be difficult or impossible to electroplate.

It is another purpose of the present invention to provide a means for electrical test between deposition of the wettable layer of solder and the bulk solder, providing the advantages of a more planar surface for probe contact, with very consistent height, less solder pick-up by the test probe and elimination of the post-probe solder reflow step.

These and other purposes of the present invention will become more apparent after referring to the following description considered in conjunction with the accompanying drawings.

SUMMARY OF INVENTION

The purposes and advantages of the present invention have been achieved by providing a method to form a solder bump on a substrate comprising the steps of: providing an electronic substrate containing a plurality of electrically conductive pads; depositing blanket metal layers onto the substrate; depositing a photo-resist material onto the blanket metal layers; exposing regions of the blanket metal layers to form a photo-resist mask; electro-depositing a layer of solder-wettable metal into the exposed regions of the photo-resist mask; removing the photo-resist mask; selectively etching the blanket metal layers outside the electro-deposited solder-wettable metal using the solder-wettable metal as an etch mask, thereby forming solder wettable metal pads; depositing bulk solder bumps onto the solder wettable metal pads; and reflowing the bulk solder bumps.

In a preferred embodiment of the present invention the deposition of the bulk solder bumps is accomplished by the steps of: providing a mold having blind cavities, the blind cavities having an arrangement representing the mirror image of the plurality of electrically conductive pads; filling the mold with a solder alloy; positioning the filled mold on the substrate such that the solder alloy is aligned with and in proximity to the solder wettable metal pads; and heating the filled mold and the substrate together such that the solder material transfers onto the solder wettable metal pads to form solder bumps.

Another purpose and advantage of the present invention have been achieved by providing a method for testing an integrated circuit device comprising the steps of: providing an electronic substrate containing a plurality of electrically conductive pads; depositing blanket metal layers onto the substrate; depositing a photo-resist material onto the blanket metal layers; exposing regions of the blanket metal layers to form a photo-resist mask; electro-depositing a layer of solder-wettable metal into the exposed regions of the photo-resist mask; removing the photo-resist mask; selectively etching the blanket metal layers outside the electro-deposited solder-wettable metal using the solder wettable metal as an etch mask, thereby forming solder wettable metal pads; and contacting the solder wettable metal pads with electrical probes to electrically test the substrate.

BRIEF DESCRIPTION OF DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

The purposes of the present invention have been achieved by providing a combination of two known solder bumping technologies, specifically, electroplating and Injection Molded Solder (IMS), to achieve a novel process which yields non-obvious results. The method allows for the deposition of complex solder alloys (eg. ternary, quaternary, etc.) onto a BLM that contains a relatively thick (10,000 Å) yet relatively low stress Ni barrier layer.

The present invention also provides a method to perform an improved pre-solder bump wafer test with a good contact surface for the probe and less probe pick-up than is possible with the current post-bump probing. This will result in reduced damage to the base wafer pad (Al or Cu for example) than is possible with pre-bump probing.

Figure 1:
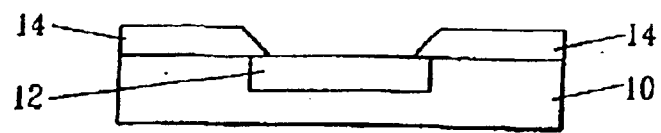
FIG. 1 is an enlarged, partial cross-sectional view of a wafer with metallic pads in a passivating layer.

A preferred embodiment of the present invention is now described with reference to the accompanying figures. Referring to FIG. 1 there is shown a conventional semiconductor wafer 10 which contains completed circuitry (not shown), a plurality of metallic pads 12 embedded in the wafer 10, and a passivating layer 14 having openings therein located on a portion of the metallic pads 12. The structure shown in FIG. 1 is fabricated using techniques well know in the art. While the examples that follow create a solder bump on a wafer, it will be appreciated by those skilled in the art that the present invention is also applicable to any substrate or electronic package requiring a solder interconnect.

Figure 2:
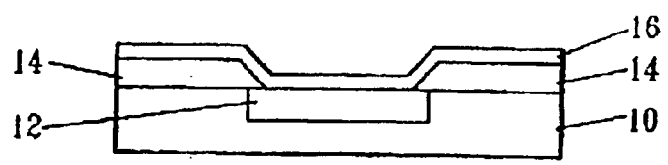
FIGS. 2–7 are enlarged, partial cross-sectional views showing the process steps employed in fabricating the BLM of the present invention.

Referring now to FIG. 2, there is shown the deposition onto the wafer 10 of one or more thin blanket metal layers used in forming the BLM. The BLM consists of a blanket metal layer portion and a plated portion. For convenience the plurality of blanket metal layers are represented as a single layer 16. This plurality of layers typically includes a first adhesion layer such as TiW, a second adhesion layer such as CrCu and a wettable terminal metal layer such as Cu or Au. The blanket metal layer portion 16 of the BLM is formed by depositing the metal layers on top of metallic pads 12 and passivating layer 14 using any conventional deposition technique such as chemical vapor deposition (CVD), physical vapor deposition (PVD, eg. sputtering), plasma enhanced vapor deposition, electro- or electroless plating and the like. The thickness of each of the metal layers used in forming the blanket metal layer portion 16 of the BLM is typically such that the overall thickness of the blanket metal layer portion 16 of the BLM is less than 10,000 Å in total thickness.

The overall thickness of the blanket metal layer portion 16 of the BLM is not critical to the present invention as long as the blanket metal layer portion 16 of the BLM is capable of carrying a current during the subsequent plating of the remaining portion of the BLM and the solder and as long as the selective etching of the blanket metal layer portion 16 of the BLM outside the plated region can be effectively accomplished.

Figure 3:
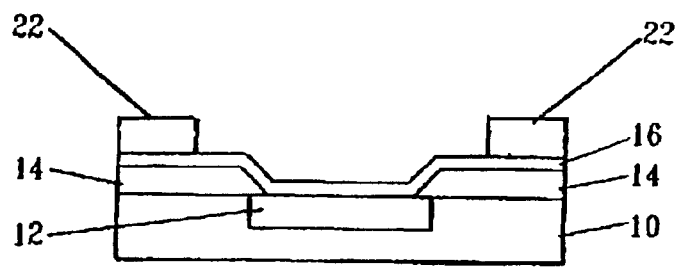

Referring now to FIG. 3 a photo-resist material 22 is deposited on the blanket metal layer portion 16 of the BLM, exposing only those regions to be electroplated by the use of standard photo-lithographic techniques.

Figure 4:
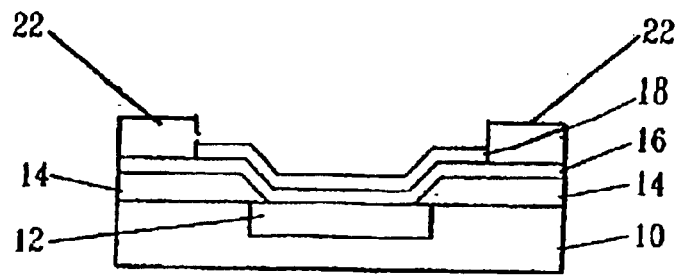
Figure 5:
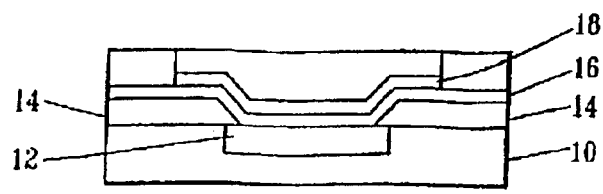

Referring now to FIG. 4 there is shown the plating portion 18 of the BLM. The plating portion 18 of the BLM is a barrier layer, such as Ni for example, of sufficient thickness for the desired application. This thickness is typically in the range of 0.2 to about 5.0 $\mu$m or higher. Referring now to FIG. 5 this is followed by the electro-plating of a thin solder wettable layer 20, preferably Sn. The thickness is preferably in the range of 3–10 $\mu$m. The thin solder wettable layer 20 is not limited to Sn, but may be any solder wettable metal such as Au, Ag or Pd.

Figure 6:
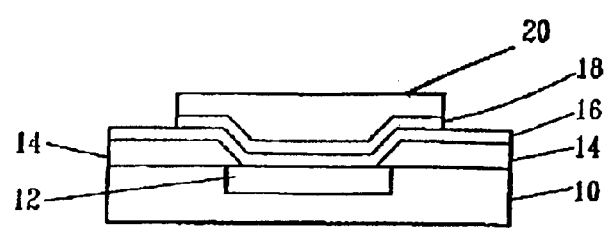

The deposition by electroplating of a thin solder wettable layer 20 is a key aspect of the present invention and as will be seen, will provide a solder wettable structure for mixing with bulk solder subsequently deposited by IMS. Referring now to FIG. 6 there is shown the removal of the photo-resist material 22 using techniques well known in the art.

Figure 7:
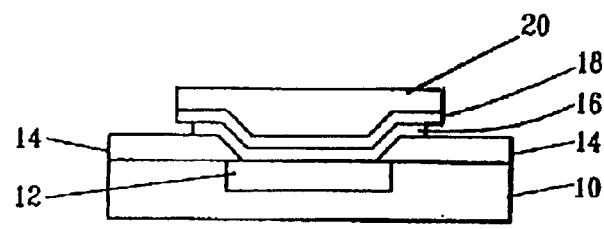

Referring now to FIG. 7, there is shown the selective etching of the blanket metal layer portion 16 of the BLM outside the plated region 18, using the plated thin solder wettable layer 20 as an etch mask to protect the blanket metal layer portion 16 of the BLM within the plated region 18. In a preferred embodiment the BLM is etched to provide an undercut of the blanket metal layer portion 16 relative to plated barrier layer 18 using the thin solder wettable layer 20 as a mask. While not essential to the present invention, the undercut etching is preferably employed to protects the BLM from attack by the subsequent solder deposition and it also relieves stresses in the final structure. Electrochemical etching, chemical etching or a combination thereof may be used depending upon the choice of metal layers in the BLM. For example, electrochemical etching is preferably used to pattern CrCu and Cu layers whereas chemical etching is preferably used to pattern TiW layers.

Subsequent to the etching step, a cleaning step may optionally be employed, as necessary, to remove, oxides from the thin solder wettable layer 20 and/or etch residues from the wafer surface. Techniques well known in the art, such as plasma cleaning, wet or dry chemical cleaning, for example, may be employed.

Figure 8:
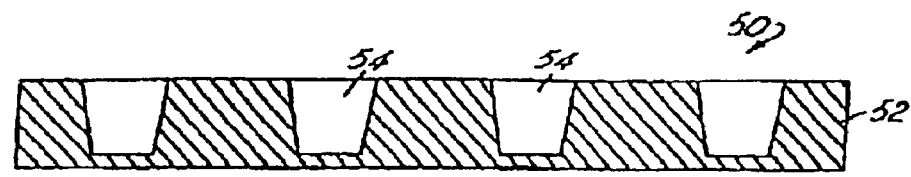
FIG. 8 is an enlarged, cross-sectional view of a glass mold for the IMS portion of the present invention.

Referring now to FIG. 8, there is shown a glass mold 50 constructed of a glass plate and having blind hole cavities 54 created by a chemical etching process of the glass. A different mold construction of a polymer/glass combination may also be used.

Figure 9:
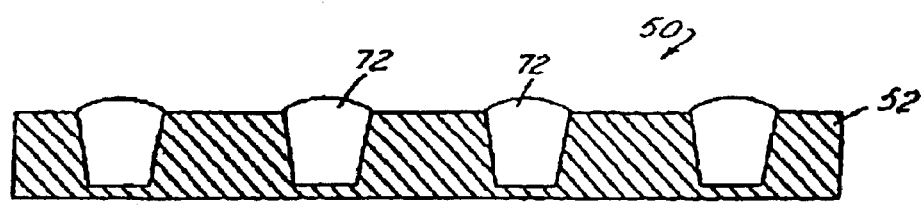
FIG. 9 is an enlarged, cross-sectional view of the glass mold of FIG. 8 filled with an IMS material.

Referring now to FIG. 9 there is shown a cross-sectional view of the glass mold 50 where the blind hole cavities 54 have been filled with an Injection Molded Solder (IMS) material 72. The blind hole cavities 54 are matched to the BLM, 16. The IMS material 72 may be any desired solder alloy. For example, the lead-containing solders include 97/3 Pb/Sn, 63/37 Sn/Pb, 90/10 Pb/Sn and 95/5 Pb/Sn or any other suitable lead containing solders. The non-lead-containing solders include those of Sn/Au, Sn/Bi, SnAg, SnSb, SnAgCu and more complex combinations thereof. Trace amounts of other desired elements may also be included in the solder alloy.

Figure 10:
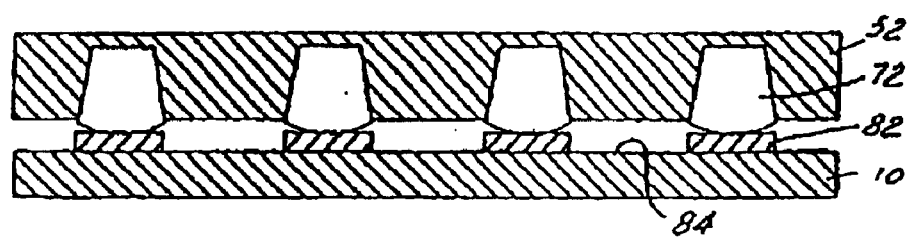
FIG. 10 is an enlarged, cross-sectional view of a filled IMS mold positioned on top of an electronic device having BLM structures.

Referring now to FIG. 10 the IMS filled mold 52 is flipped over and positioned on the wafer 10 having BLM structures 82 built on the top surface 84 of the wafer 10 and matching the filled cavities 72 to wafer BLM's 82. The BLM structure 82 corresponds to, and is a simplified representation of, the layered BLM structure shown in FIG. 7 and represented as layers 16, 18 and 20. The mold 52 and the wafer 10 are placed together intimately such that the IMS material 72 are in intimate contact with the top thin solder wettable layer 20 of the BLM structures 82. The combined mold/wafer structure is then subjected to a reflow temperature of the solder to cause a flow in the solder toward the BLM structures 82. For example, a suitable reflow temperature which is dependent on different solder materials is 360° C. for a high Pb, high temperature solder and 230° C. for a eutectic Pb/Sn solder.

Figure 12:
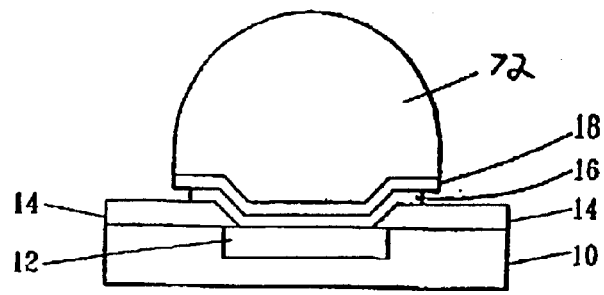
FIG. 12 is an enlarged, partial cross-sectional view of the solder bump prepared in accordance with the method of the present invention.
Figure 11:
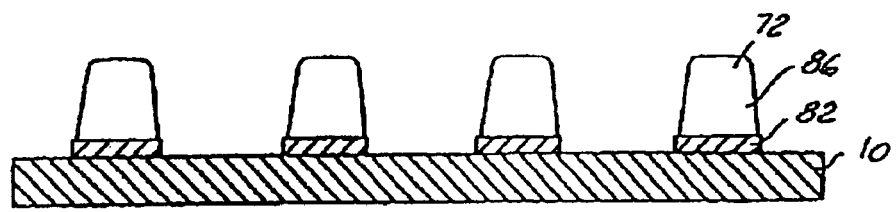
FIG. 11 is an enlarged, cross sectional view of the electronic structure shown in FIG. 10 with the IMS transferred on top.

FIG. 11 shows the wafer 10 after the transfer reflow process for the solder bumps 72 is conducted and the mold 52 is removed. It is seen that solder bumps 72 while transferred to the BLM structures 16 retain substantially the shape of the mold cavities 54 in mold 52. While a transparent or semi-transparent mold enables fairly accurate alignment between the mold 52 and wafer 10, some misalignment between the solder bumps 72 and the BLM structures 16 may nevertheless occur. It may therefore be desirable to conduct a second reflow process at a temperature similar to that used in the first transfer reflow process for the solder bumps. This is shown in FIG. 12 where after the second reflow process the base 86 of the solder bumps 72 is integrated with the BLM bumps 82 into a substantially uniform metal structure.

The present invention also provides a new and improved method for the electrical test of the wafer. Electrical wafer level test is currently performed after solder reflow. As an alternative, the present invention allows electrical test to be performed after the deposition of the thin solder wettable layer 20 discussed above. At this stage the BLM surface is flatter and harder than after the subsequent solder bump 72 deposition, primarily due to the lesser thickness of solder wettable layer 20. Electrical test at this stage would therefore result in less solder damage and less solder pick-up by the probe, yet still be amenable to existing solder-compatible probe technologies.

Therefore by allowing the electrical test to be performed on a flat thin solder wettable layer the present invention also offers the advantages of a method to wafer test with less damage to the base wafer pad (Al or Cu) than with pre-bump probing as well as a good contact surface, a more consistent contact height for probe contact, and with less probe pick-up than with post-bump probing. A further advantage of performing electrical test at this point is the elimination of the post-probe solder reflow step.

Further advantages of the present invention is that it enables a much larger variety of solders to be employed in a wafer bumping process that uses electroplating manufacturing processes and techniques, thereby retaining the advantages of those processes and techniques. Conventional electroplated wafer bump manufacturing using multi-component solders, i.e., greater than 2 components, typically requires sequential plating steps. This present invention provides a wafer bumping manufacturing method that deposits difficult-to-plate metals including solder containing trace amounts of one or more metals, without compromising the advantages of electroplating, such as high bump count per unit and low stress barrier layers.

Further advantages of the present invention are improvements in solder bump diameter uniformity. The IMS process can deliver very consistent solder volumes that are essentially dependent upon the volume of the cavities in the mold, for which there exists processes in the art to produce the cavities very repetitively and consistently. Solder volumes deposited from the IMS process will not vary as a function of varying bump density on a given wafer, whereas such solder variation dependency may occur in some electroplating processes.

Further advantages of the present invention are simplified lithography steps. Because only a diffusion barrier layer and a thin solder layer are subject to electroplating in the present invention, the photo-resist material may be considerably thinner than when a full solder bump is electroplated. This thinner layer of photo-resist material allows for greater flexibility in the selection of resist deposition techniques, as available in the prior art. This thinner layer is also easier to photo-expose and develop during the photo-resist patterning steps. Finally, removal of photo-resist subsequent to the electroplating steps is facilitated by means of a thinner layer of photo-resist.

The present invention offers a wide variety of applications. These include wafer bumping manufacturing using solder alloys whose plating baths are incompatible with patterning film and the conversion of a manufacturing line with electroplating from conventional lead solders to lead-free solders with the ability to utilize existing tool-sets and infrastructure.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method to form a solder bump on an electronic package comprising the steps of;

provide an electronic package containing a plurality of electrically conductive pads;

depositing at least one blanket metal layer onto said electronic package;

depositing a photo-resist material onto said at least one blanket metal layer;

exposing said photo-resist material on said at leas one blanket metal layer to form a photo-resist mask;

electro-depositing a layer of solder-wettable metal into the exposed regions of the blanket metal layer removing said photo-resist mask;

selectively etching said at least on blanket metal layer outside the electro-deposited solder-wettable metal using said solder-wettable metal as an etch mask, thereby forming solder wettable metal pads;

depositing bulk solder bumps onto said solder wettable metal pads; and reflowing said bulk solder bumps.

2. The method of claim 1 wherein deposition of said bulk solder bumps is accomplished by the steps of:

providing a mold having blind cavities, said blind cavities having an arrangement representing the mirror image of said plurality of electrically conductive pads;

filling said mold with a solder alloy;

positioning said filled mold on said electronic package such that said solder alloy is aligned with and in proximity to said solder wettable metal pads; and heating said filled mold and said electronic package together such that said solder alloy transfers onto said solder wettable metal pads to form solder bumps.

3. The method of claim 1 wherein said electro-deposited solder wettable metal is Tin.

4. The method of claim 1 wherein said electro-deposited solder wettable metal is Gold.

5. The method of claim 1 wherein said electro-deposited solder wettable metal is Silver.

6. The method of claim 1 wherein said electro-deposited solder wettable metal is Palladium.

7. The method of claim 1 wherein the thickness of the electro-deposited solder wettable metal is between 1 and 15 $\mu$m.

8. The method of claim 1 where the bulk solder bumps comprise a ternary alloy.

9. The method of claim 1 where the bulk solder bumps comprise a quaternary alloy.

10. The method of claim 1 where the bulk solder bumps comprise a lead free alloy.

11. The method of claim 1 further comprising the step of electra-depositing a barrier layer in said exposed regions of at least one blanket metal layer prior to said step of electro-depositing a layer of solder-wettable metal.

12. The method of claim 11 wherein said electro-deposited barrier layer Nickel.

13. The method of claim 11 wherein the thickness of said electro-deposited barrier layer is between 0.2 and 2.0 $\mu$m.

14. The method of claim 1 further comprising the step of cleaning said electronic package after said step of selectively etching said at least one blanket metal layer outside the plated region.

15. A method for testing an electronic package comprising the steps of:

providing an electronic package containing a plurality of electrically conductive pads;

depositing at least one blanket metal layer onto said electronic package;

depositing a photo-resist material onto said at least one blanket metal layer;

exposing said photo-resist material on said at least one blanket metal layer to form a photo-resist mask;

electro-depositing layer of solder-wettable metal into the exposed regions of blanket metal layer;

removing said photo-resist mask;

selectively etching said at least one blanket metal layer outside the electro-deposited solder-wettable metal using said solder-wettable metal as an etch mask, thereby forming solder wettable metal pads; and contacting said solder wettable metal pads with electrical probes to electrically test said electronic package.

16. The method of claim 15 further comprising the step of electra-depositing a barrier layer in said exposed regions of at least one blanket metal layer prior to said step of electro-depositing a layer of solder-wettable metal.

17. The method of claim 15 further comprising the step of cleaning said electronic package after said step of selectively etching said at least one blanket metal layer outside a plated region.

18. The method of claim 15 further comprising the steps of:

depositing bulk solder bumps onto said solder wettable metal pads; and reflowing said bulk solder bumps.

19. The method of claim 18 wherein deposition of said bulk solder bumps is accomplished by the steps of:

providing a mold having blind cavities, said blind cavities having an arrangement representing the mirror image of said plurality of electrically conductive pads;

filling said mold with a solder alloy;

positioning said filled mold on said electronic package such that said solder alloy is aligned with and in proximity to said solder wettable metal pads; and heating said filled mold and said electronic package together such that said solder alloy transfers onto said solder wettable metal pads to form wider bumps.

* * * * *